(12) United States Patent
Wu et al.

(10) Patent No.: US 11,515,339 B2
(45) Date of Patent: Nov. 29, 2022

(54) DISPLAY DEVICE

(71) Applicant: Au Optronics Corporation, Hsinchu (TW)

(72) Inventors: Yueh-Chi Wu, Hsinchu (TW); Ti-Kuei Yu, Hsinchu (TW); Hung-Chia Liao, Hsinchu (TW); Shu-Wen Liao, Hsinchu (TW); Shiang-Lin Lian, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 204 days.

(21) Appl. No.: 16/941,492

(22) Filed: Jul. 28, 2020

(65) Prior Publication Data

US 2021/0057450 A1  Feb. 25, 2021

Related U.S. Application Data

(60) Provisional application No. 62/889,181, filed on Aug. 20, 2019, provisional application No. 62/901,837, filed on Sep. 18, 2019.

(30) Foreign Application Priority Data

Feb. 18, 2020 (TW) .................... 109105173

(51) Int. Cl.
    *G02F 1/1362*    (2006.01)
    *H01L 27/12*    (2006.01)
    (Continued)

(52) U.S. Cl.
    CPC .......... *H01L 27/124* (2013.01); *G02F 1/1368* (2013.01); *G02F 1/13456* (2021.01);
    (Continued)

(58) Field of Classification Search
    CPC ................................ G02F 1/136286
    See application file for complete search history.

(56) References Cited

U.S. PATENT DOCUMENTS

9,356,051 B2    5/2016  Wu et al.
9,379,139 B2    6/2016  Jeon et al.
                (Continued)

FOREIGN PATENT DOCUMENTS

CN    101710471    5/2010
CN    104570527    4/2015
                (Continued)

*Primary Examiner* — Sang V Nguyen
(74) *Attorney, Agent, or Firm* — JCIPRNET

(57) ABSTRACT

A display device has a display area and a peripheral area and includes data lines, scan lines, gate transmission lines, and sub-pixels. The data lines and the gate transmission lines extend from the peripheral area into the display area. The data lines located in the display area extend along a first direction. The scan lines are located in the display area and extend along a second direction intersecting the first direction. The gate transmission lines are electrically connected to the scan lines. One of the gate transmission lines includes first, second, and third wires located in the display area. The first and third wires extend along the first direction. The second wire extends along the second direction. The first, second and third wires are electrically connected in sequence. The third wire is electrically connected to one of the scan lines.

22 Claims, 16 Drawing Sheets

(51) Int. Cl.
*G09G 3/3266* (2016.01)
*G09G 3/3275* (2016.01)
*G02F 1/1345* (2006.01)
*G02F 1/1368* (2006.01)

(52) U.S. Cl.
CPC ..... *G02F 1/136286* (2013.01); *G09G 3/3266* (2013.01); *G09G 3/3275* (2013.01); *G02F 1/136218* (2021.01); *G09G 2300/0426* (2013.01)

(56) References Cited

U.S. PATENT DOCUMENTS

| | | | |
|---|---|---|---|
| 2015/0115292 A1* | 4/2015 | Jeon | H01L 27/124 |
| | | | 257/88 |
| 2015/0214246 A1 | 7/2015 | Wu et al. | |
| 2018/0166037 A1* | 6/2018 | Lee | G09G 3/3677 |
| 2021/0056882 A1* | 2/2021 | Lee | G09G 3/20 |
| 2021/0057452 A1* | 2/2021 | Hsu | G02F 1/13 |

FOREIGN PATENT DOCUMENTS

| | | |
|---|---|---|
| CN | 104575349 | 4/2015 |
| CN | 104808356 | 7/2015 |
| CN | 106200176 | 12/2016 |
| CN | 106504689 | 3/2017 |

* cited by examiner

DISPLAY DEVICE

CROSS-REFERENCE TO RELATED APPLICATION

This application claims the priority benefit of U.S. provisional application Ser. No. 62/889,181, filed on Aug. 20, 2019, U.S. provisional application Ser. No. 62/901,837, filed on Sep. 18, 2019, and Taiwan application serial no. 109105173, filed on Feb. 18, 2020. The entirety of each of the above-mentioned patent applications is hereby incorporated by reference herein and made a part of this specification.

BACKGROUND

Technical Field

The disclosure relates to a display device.

Description of Related Art

Products with display devices such as mobile phones, televisions, and tablet computers have become indispensable electronic devices in modern life. In order to attract consumers to purchase their own products, many display device manufacturers strive to reduce the frame of the display device so that the display device can have a better appearance. However, reducing the frame of the display device increases the density of the wires in the display device, which is likely to influence the display quality of the display device.

SUMMARY

The disclosure provides a display device which can reduce the negative influence of the gate transmission line on the display quality.

At least one embodiment of the disclosure provides a display device. The display device has a display area and a peripheral area and includes data lines, scan lines, gate transmission lines and sub-pixels. The data lines extend from the peripheral area into the display area. The data lines located in the display area extend along a first direction. The scan lines are located in the display area and extend along a second direction intersecting the first direction. The gate transmission lines extend from the peripheral area into the display area and are electrically connected to the scan lines. One of the gate transmission lines includes a first wire, a second wire and a third wire located in the display area. The first wire and the third wire extend along the first direction. The second wire extends along the second direction. The first wire, the second wire, and the third wire are electrically connected in sequence. The third wire is electrically connected to one of the scan lines. The sub-pixels are electrically connected to the scan lines and the data lines.

At least one embodiment of the disclosure provides a display device. The display device has a display area and a peripheral area and includes data lines, first to n-th scan lines, first to n-th gate transmission lines and sub-pixels. The data lines extend from the peripheral area into the display area, and the data lines located in the display area extend along a first direction. The first to n-th scan lines are located in the display area and extend along a second direction intersecting the first direction, where n is an integer greater than 1, and the first to n-th scan lines are arranged in sequence along the first direction. The first to n-th gate transmission lines extend from the peripheral area into the display area and are electrically connected to the first to n-th scan lines, respectively. The first to n-th gate transmission lines are arranged in dislocation in the display area. The sub-pixels are electrically connected to the first to n-th scan lines and the data lines.

DESCRIPTION OF THE EMBODIMENTS

Figure 1:
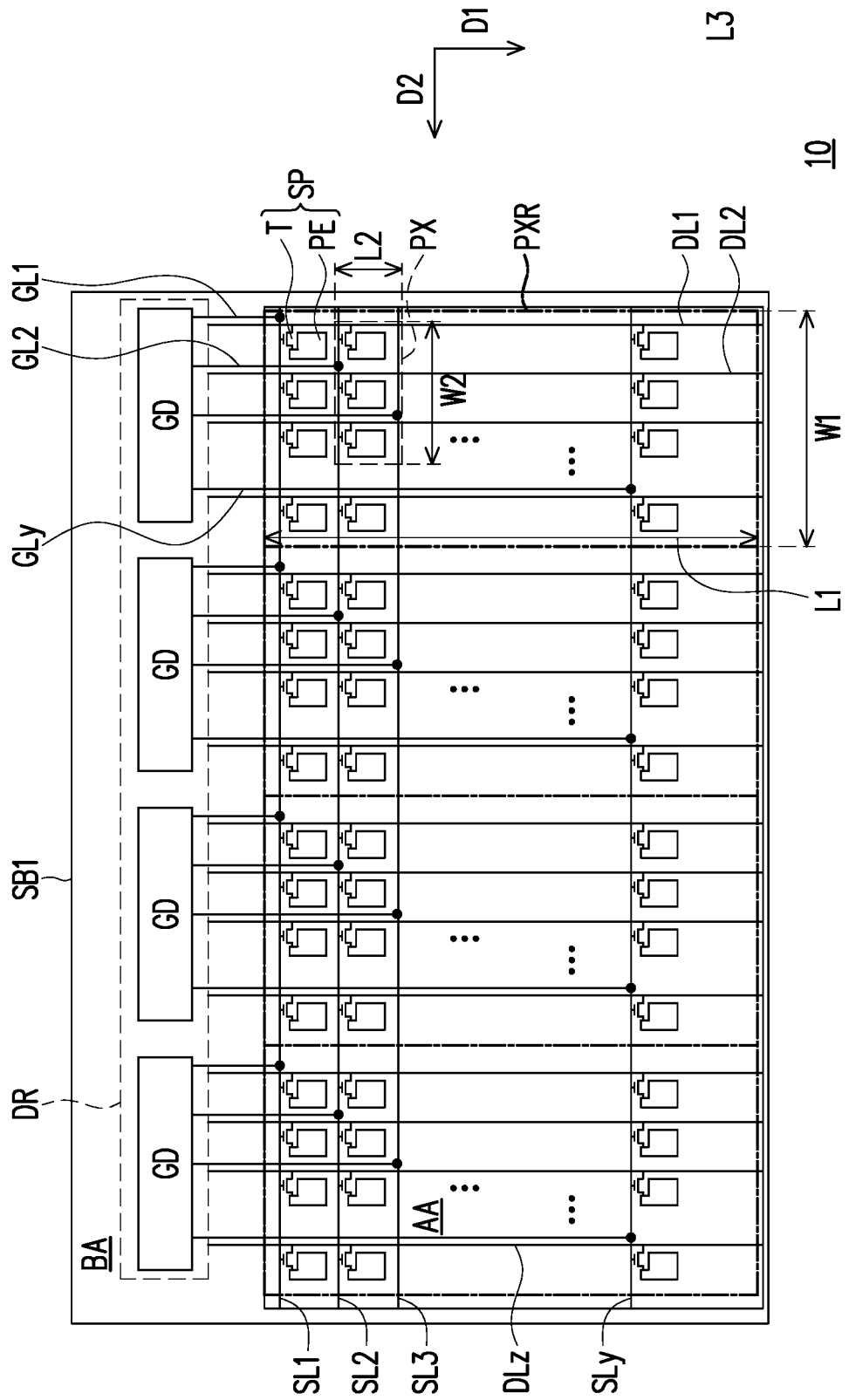
FIG. 1 is a schematic top view of a display device according to an embodiment of the disclosure.

In the following, multiple embodiments of the disclosure will be disclosed with reference to the drawings. For clear description, many practical details will be described together in the following description. However, it should be understood that these practical details should not be used to limit the disclosure. That is to say, in some embodiments of the disclosure, these practical details are optional. In addition, in order to simplify the drawings, some conventional structures and elements will be omitted or shown by simple illustrations in the drawings.

Throughout the specification, the same reference numerals denote the same or similar elements. In the drawings, for clarity, the thickness of layers, films, plates, areas, and the like are magnified. It should be understood that when an element such as a layer, a film, an area, or a substrate is indicated to be "on" another element or "connected to" another element, it may be directly on another element or connected to another element, or other elements may exist therebetween. In contrast, when an element is indicated to be "directly on another element" or "directly connected to" another element, other elements do not exist therebetween. As used herein, "to connect" may indicate to physically and/or electrically connect. Furthermore, when two elements are "electrically connected" or "coupled, other elements may exist between the two elements.

FIG. 1 is a schematic top view of a display device according to an embodiment of the disclosure.

Please refer to FIG. 1. A display device 10 has a display area AA and a peripheral area BA and includes multiple data lines DL1 to DLz, multiple scan lines SL1 to SLy, multiple gate transmission lines GL1 to GLy and multiple sub-pixels SP on a substrate SB1. In the embodiment, the display device 10 further includes a driving circuit DR located in the peripheral area BA. In the embodiment, the display device 10 is driven unilaterally, and the driving circuit DR is located on one side of the display area AA.

The data lines DL1 to DLz are electrically connected to the driving circuit DR. For example, the data lines DL1 to DLz are electrically connected to a source driving element (not shown) in the driving circuit DR. The data lines DL1 to DLz extend from the peripheral area BA into the display area AA. The data lines DL1 to DLz located in the display area AA extend along a first direction D1. Although in the embodiment, the data lines DL1 to DLz located in the peripheral area BA also extend along the first direction D1, the disclosure is not limited thereto. In other embodiments, the data lines DL1 to DLz located in the peripheral area BA include fan-out lines, and the data lines DL1 to DLz located in the peripheral area BA may not be parallel to each other.

The gate transmission lines GL1 to GLy are electrically connected to the driving circuit DR. For example, the gate transmission lines GL1 to GLy are electrically connected to X gate driving elements GD in the driving circuit DR, where X is an integer greater than or equal to 1. In the embodiment, the driving circuit DR includes four gate driving elements GD, and each gate driving element GD is connected to the gate transmission lines GL1 to GLy. In other words, the display device 10 includes four gate transmission lines GL1, four gate transmission lines GL2, . . . and four gate transmission lines GLy, and the gate driving elements GD are electrically connected to different gate transmission lines GL1, different gate transmission lines GL2, . . . and different gate transmission lines GLy, respectively.

The scan lines SL1 to SLy are located in the display area AA and extend along a second direction D2 intersecting the first direction D1. The gate transmission lines GL1 to GLy extend from the peripheral area BA into the display area AA and are electrically connected to the scan lines SL1 to SLy. In the embodiment, the gate transmission lines GL1 are electrically connected to the scan line SL1; the gate transmission lines GL2 are electrically connected to the scan line SL2; the gate transmission lines GLy are electrically connected to the scan line SLy; and the electrical connection of other gate transmission lines to the scan lines may be deduced by analogy.

In the embodiment, each gate driving element GD is electrically connected to the same scan line through different gate transmission lines. For example, each gate driving element GD is electrically connected to the same scan line SL1 through different gate transmission lines GL1, and each gate driving element GD is electrically connected to the same scan line SL2 through different gate transmission lines GL2, and each gate driving element GD is electrically connected to the same scan line SLy through different gate transmission lines GLy. By providing signals to the same scan line through multiple gate driving elements GD, the charging time of the scan lines SL1 to SLy may be shortened.

The sub-pixels SP are electrically connected to the scan lines SL1 to SLy and the data lines DL1 to DLz. For example, each sub-pixel SP includes a switching element T and a pixel electrode PE electrically connected to the switching element T, and the switching element T is electrically connected to a corresponding scan line and a corresponding data line. In the embodiment, the sub-pixels SP include red sub-pixels, green sub-pixels, and blue sub-pixels. For example, the sub-pixel SP overlapping a red filter element (not shown) is a red sub-pixel, and the sub-pixel SP overlapping a green filter element (not shown) is a green sub-pixel, and the sub-pixel SP overlapping a blue filter element (not shown) is a blue sub-pixel. The sub-pixels SP are arrayed into multiple pixels PX. For example, each pixel PX includes a red sub-pixel, a green sub-pixel, and a blue sub-pixel. In some embodiments, each pixel PX may include sub-pixels of other colors. In the embodiment, each pixel PX includes three sub-pixels SP, and each pixel PX is electrically connected to one scan line and three data lines.

The pixels PX are arranged in N rows along the first direction D1 and are arranged in M rows along the second direction D2. For example, the display device 10 includes 4320 scan lines and 23040 data lines. Therefore, the pixels PX are arranged in 4320 rows along the first direction D1 and are arranged in 7680 rows along the second direction D2 (that is, 23040 divided by 3).

In some embodiments, the X gate driving elements GD divide the display area AA into X pixel areas PXR, and the pixels PX in each pixel area PXR are arranged in M/X rows along the second direction D2 and are arranged in N rows along the first direction D1. Therefore, the length L1 of each pixel area PXR in the first direction D1 is about the lengths L2 of N pixels PX, and the width W1 of each pixel area PXR in the second direction D2 is about the widths W2 of M/X pixels PX. Although in FIG. 1, the length L2 of the pixels PX is not equal to the width W2 of the pixels PX, the disclosure is not limited thereto. In other embodiments, the length L2 of the pixels PX is substantially equal to the width W2 of the pixels PX.

In the embodiment, each pixel area PXR overlaps N gate transmission lines. In some embodiments, M/X is less than N. In other words, in each pixel area PXR, the number of pixels PX in the second direction D2 is less than the number of gate transmission lines. In other embodiments, the display device has a 2DhG structure, and each of the scan lines SL1 to SLy is electrically connected to two rows of pixels PX. Therefore, each pixel area PXR overlaps N/2 gate transmission lines, and M/X is less than N/2.

Figure 2A:
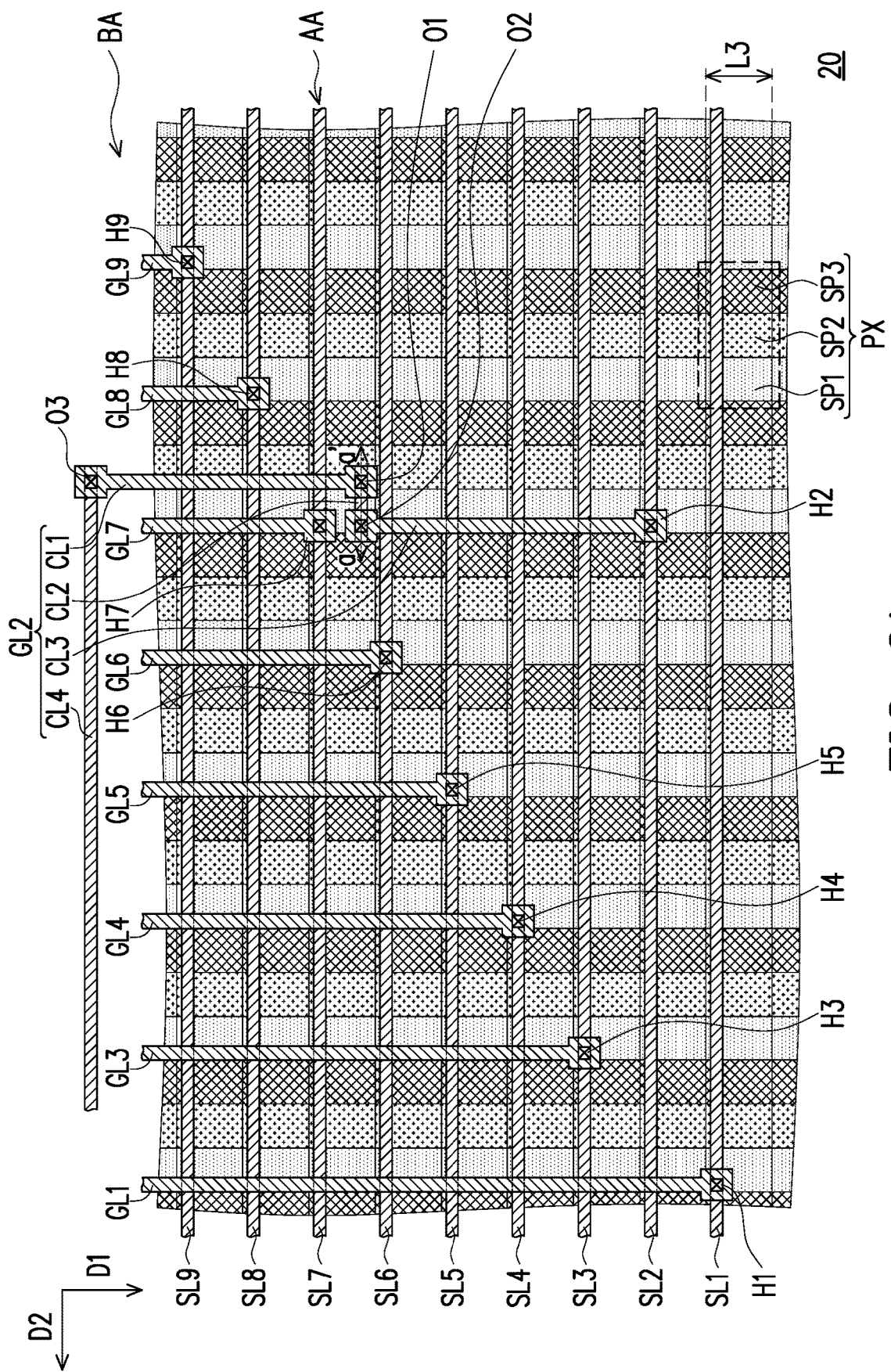
FIG. 2A is a schematic top view of a display device according to an embodiment of the disclosure.
Figure 2B:
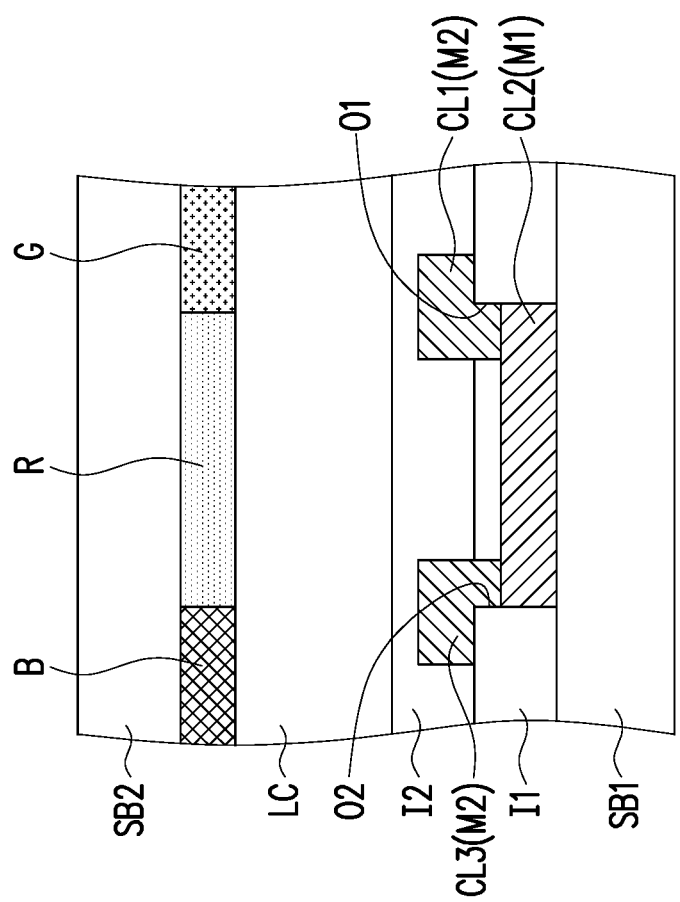
FIG. 2B is a schematic cross-sectional view taken along the line a-a' in FIG. 2A.

FIG. 2A is a schematic top view of a display device according to an embodiment of the disclosure. FIG. 2B is a schematic cross-sectional view taken along the line a-a' in FIG. 2A. It is noted that the embodiment of FIG. 2A and FIG. 2B uses the reference numerals and a part of the contents of the embodiment of FIG. 1, and the same or similar reference numerals are used to denote the same or similar elements, and the description of the same technical content is omitted. For the description of the omitted part, reference may be made to the foregoing embodiment, and details are not described herein. For the convenience of description, some components (such as switching elements, pixel electrodes, and data lines) are omitted in FIG. 2A and FIG. 2B.

Please refer to FIG. 2A and FIG. 2B. In the embodiment, a display device 20 includes a substrate SB2 and a red filter element R, a green filter element G, and a blue filter element B disposed on the substrate SB2. Each pixel PX includes a red sub-pixel SP1 overlapping the red filter element R, a green sub-pixel SP2 overlapping the green filter element G, and a blue sub-pixel SP3 overlapping the blue filter element B. In the embodiment, the display device 20 includes a first metal layer M1 disposed on the substrate SB1, a first insulating layer I1 disposed on the first metal layer M1, a second metal layer M2 disposed on the first insulating layer I1, a second insulating layer I2 disposed on the second metal layer M2, and a display medium layer LC (e.g., liquid crystal) between the substrate SB1 and the substrate SB2. Although in the embodiment, the display device 20 is exemplified as a liquid crystal panel, the disclosure is not limited thereto. In other embodiments, the display device may be an organic light emitting diode display panel, a micro light emitting diode display panel, or other types of display panels.

In the embodiment, the gate transmission lines include the first to n-th stages. In other words, when displaying an image, the first to n-th gate transmission lines are scanned in one cycle. In other embodiments, tens of, hundreds of, or other numbers of gate transmission lines may be scanned in one cycle; that is, the disclosure does not limit n to 9. In other words, the next-stage gate transmission line of the ninth gate transmission line GL9 (e.g., the gate transmission line not shown to the right of the gate transmission line GL9 in FIG. 2A) may be the tenth gate transmission line.

The number of pixels PX in the second direction D2 is less than the number of gate transmission lines. In the embodiment, eight pixels PX in the second direction D2 correspond to nine gate transmission lines (e.g., gate transmission lines GL1 to GL9). The terminals of the gate transmission lines GL1 to GL9 at the gate driving element GD are arranged in sequence, for example. For example, the gate transmission lines GL1 to GL9 at the gate driving element GD are arranged in sequence from left to right, but the disclosure is not limited thereto.

One of the gate transmission lines GL1 to GL9 (e.g., the gate transmission line GL2) includes a first wire CL1, a second wire CL2, and a third wire CL3 in the display area AA. The first wire CL1 and the third wire CL3 extend along the first direction D1. The second wire CL2 extends along the second direction D2. The first wire CL1, the second wire CL2, and the third wire CL3 are electrically connected in sequence. The third wire CL3 is electrically connected to one of the scan lines SL1 to SL9 (e.g., the scan line SL2). In the embodiment, the gate transmission line GL2 further includes a fourth wire CL4 located in the peripheral area BA. The fourth wire CL4 extends along the second direction D2 and crosses the gate transmission lines GL3 to GL7. The fourth wire CL4 is electrically connected to the first wire CL1. By the disposition of the fourth wire CL4, the area occupied by the gate transmission line GL2 in the display area AA may be reduced. In the embodiment, the second wire CL2 and the fourth wire CL4 of one of the gate transmission lines GL1 to GL9 (e.g., the gate transmission line GL2) and the scan lines SL1 to SL9 belong to the same conductive film layer (e.g., the first metal layer M1); that is, the second wire CL2 and the scan lines SL1 to SL9 are formed by the same patterning process. In the embodiment, the first wire CL1 and the third wire CL3 of one of the gate transmission lines GL1 to GL9 (e.g., the gate transmission line GL2), the other of the gate transmission lines GL1 to GL9 (e.g., the gate transmission lines GL1 and GL3 to GL9) and the data lines DL belong to the same conductive film layer (e.g., the second metal layer M2); that is, the first wire CL1, the third wire CL3, the other of the gate transmission lines GL1 to GL9 and the data lines DL are formed by the same patterning process.

In the embodiment, the scan lines SL1 to SL9, the second wire CL2 and the fourth wire CL4 belong to the first metal layer M1, and the gate transmission line GL1, the gate transmission lines GL3 to GL9, the data lines (please refer to FIG. 1), the first wire CL1 and the third wire CL3 belong to the second metal layer M2. The gate transmission lines GL1 to GL9 are electrically connected to the scan lines SL1 to SL9 through openings H1 to H9, respectively, and the openings H1 to H9 penetrate the first insulating layer I1. The first wire CL1 and the third wire CL3 are electrically connected to the second wire CL2 through openings O1 and O2, respectively, and the fourth wire CL4 is electrically connected to the first wire CL1 through an opening O3, and the openings O1, O2 and O3 penetrate the first insulating layer I1.

In the embodiment, the third wire CL3 of the gate transmission line GL2 is aligned with the gate transmission line GL7, but the disclosure is not limited thereto. In other embodiments, the third wire CL3 of the gate transmission line GL2 is aligned with the gate transmission line GL8 or the gate transmission line GL9. In the embodiment, the first wire CL1 of the gate transmission line GL2 is located between the gate transmission line GL7 and the gate transmission line GL8, but the disclosure is not limited thereto. In other embodiments, the first wire CL1 of the gate transmission line GL2 is located between the gate transmission line GL6 and the gate transmission line GL7 or between the gate transmission line GL8 and the gate transmission line GL9. In the embodiment, the gate transmission line GL2 includes the first to fourth wires CL1 to CL4, but the disclosure is not limited thereto. In other embodiments, one of the gate transmission lines GL3 to GL8 may include the first to fourth wires CL1 to CL4, which allows eight pixels PX of the display device to correspond to nine gate transmission lines GL1 to GL9 in the second direction D2.

In the embodiment, the gate transmission lines GL1 and GL3 to GL9 overlap the boundaries between the red sub-pixels SP1 and the blue sub-pixels SP3, thereby reducing the negative influence of the gate transmission lines GL1 and GL3 to GL9 on the display quality.

The third wire CL3 of the gate transmission line GL2 overlaps the boundary between the red sub-pixels SP1 and the blue sub-pixels SP3, and the first wire CL1 of the gate transmission line GL2 overlaps the boundary between the red sub-pixels SP1 and the green sub-pixels SP2 or the boundary between the blue sub-pixels SP3 and the green sub-pixels SP2, thereby reducing the negative influence of the gate transmission line GL2 on the display quality. Extending the length of the third wire CL3 may shorten the first wire CL1 and further reduce the negative influence of the gate transmission line GL2 on the display quality. In the embodiment, the length of the third wire CL3 is greater than the length L3 of each sub-pixel (or the length of the pixel PX).

Figure 3:
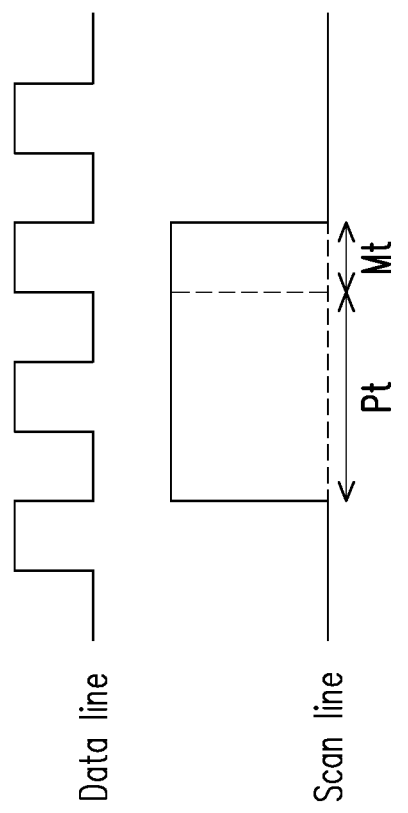
FIG. 3 is a signal waveform diagram of the scan lines and the data lines of the display device of FIG. 2A.

FIG. 3 is a signal waveform diagram of the scan lines and the data lines of the display device of FIG. 2A.

In each frame (or in each scan cycle), each of the scan lines SL1 to SL9 has a main charging time Mt and a pre-charging time Pt. The pre-charging of the scan line is performed in the pre-charging time Pt, so that the scan line may reach a predetermined voltage in the main charging time Mt. The voltage on the scan line during the pre-charging time Pt may be greater than, equal to or less than the voltage on the scan line during the main charging time Mt.

The pre-charging time Pt is t times the main charging time Mt, where t is an integer greater than 1. The pre-charging time Pt of each scan line may overlap the main charging time Mt of the scan lines of the previous stages and the pre-charging time Pt of the scan lines of the following stages. For example, in the embodiment, the pre-charging time Pt is three times (t=3) the main charging time Mt, and the pre-charging time Pt of the second scan line SL2 overlaps the pre-charging time of the third scan line SL3, the pre-charging time Pt of the fourth scan line SL4, and the pre-charging time Pt of the fifth scan line SL5. Therefore, the second gate transmission line GL2 is more likely to be mutually influenced by the third scan line SL3, the fourth scan line SL4, and the fifth scan line SL5.

Please refer to FIG. 2A. The length of the third wire CL3 is greater than the lengths L3 of t (e.g., three) sub-pixels, and the third wire CL3 overlaps the third scan line SL3, the fourth scan line SL4, the fifth scan line SL5, and the sixth scan line SL6. The third wire CL3 overlaps the boundary between the red sub-pixels SP1 and the blue sub-pixels SP3. Therefore, even if the second gate transmission line GL2 is likely to be mutually influenced by the third scan line SL3, the fourth scan line SL4, and the fifth scan line SL5, the negative influence of the gate transmission line GL2 on the display quality may be reduced.

Based on the above, the gate transmission line GL2 includes the first wire CL1 extending along the first direction D1, the second wire CL2 extending along the second direction D2, and the third wire CL3 extending along the first direction D1, whereby the influence of the gate transmission line GL2 on the display quality of the display device 20 may be reduced.

Figure 4:
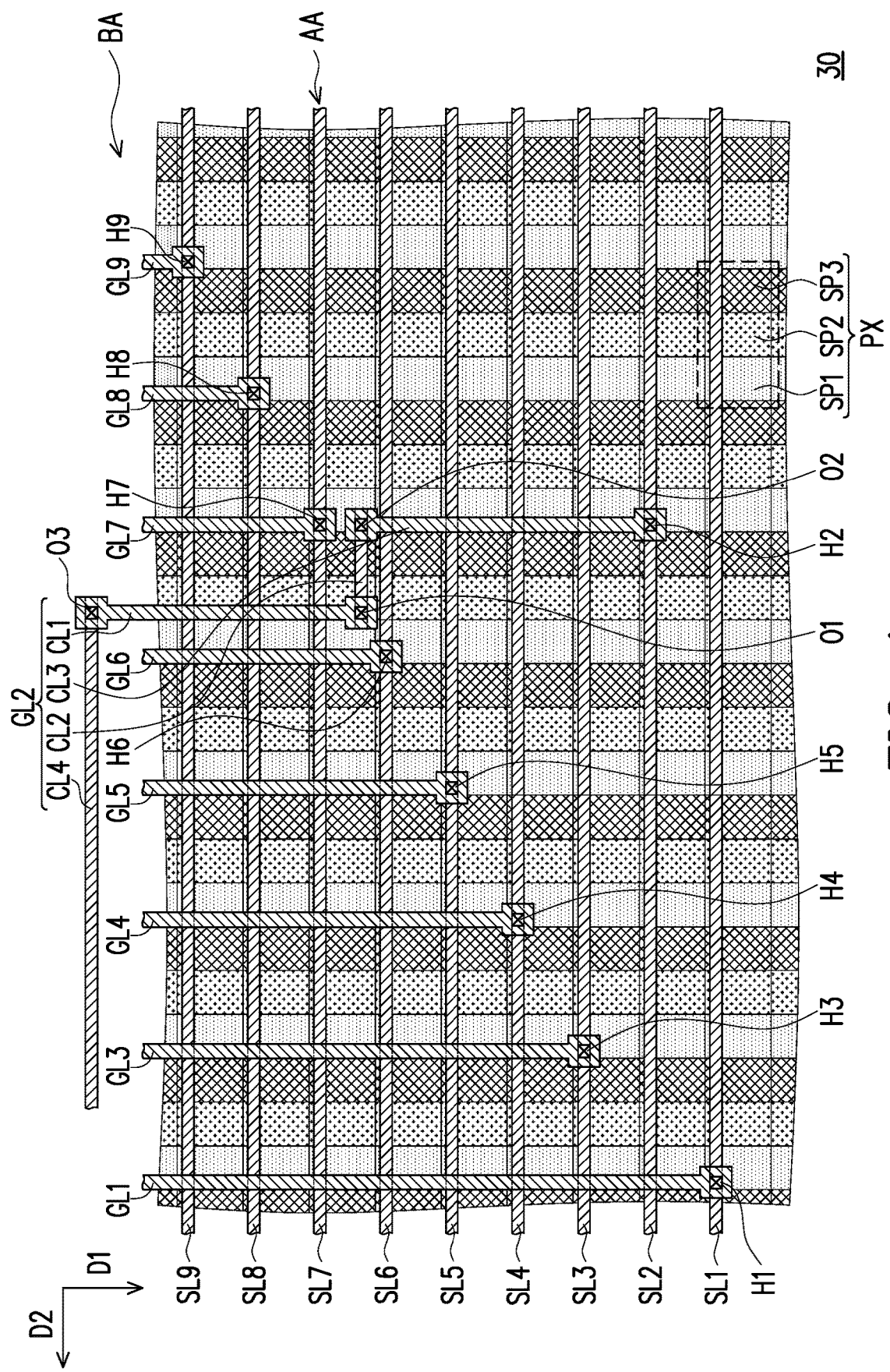
FIG. 4 is a schematic top view of a display device according to an embodiment of the disclosure.

FIG. 4 is a schematic top view of a display device according to an embodiment of the disclosure. It is noted that the embodiment of FIG. 4 uses the reference numerals and a part of the contents of the embodiment of FIG. 2A and FIG. 2B, and the same or similar reference numerals are used to denote the same or similar elements, and the description of the same technical content is omitted. For the description of the omitted part, reference may be made to the foregoing embodiment, and details are not described herein.

The main difference between a display device 30 of FIG. 4 and the display device 20 of FIG. 2A is that the first wire CL1 of the gate transmission line GL2 of the display device 30 is located between the gate transmission line GL6 and the gate transmission line GL7.

Based on the above, the gate transmission line GL2 includes the first wire CL1 extending along the first direction D1, the second wire CL2 extending along the second direction D2, and the third wire CL3 extending along the first direction D1, whereby the influence of the gate transmission line GL2 on the display quality of the display device 30 may be reduced.

Figure 5:
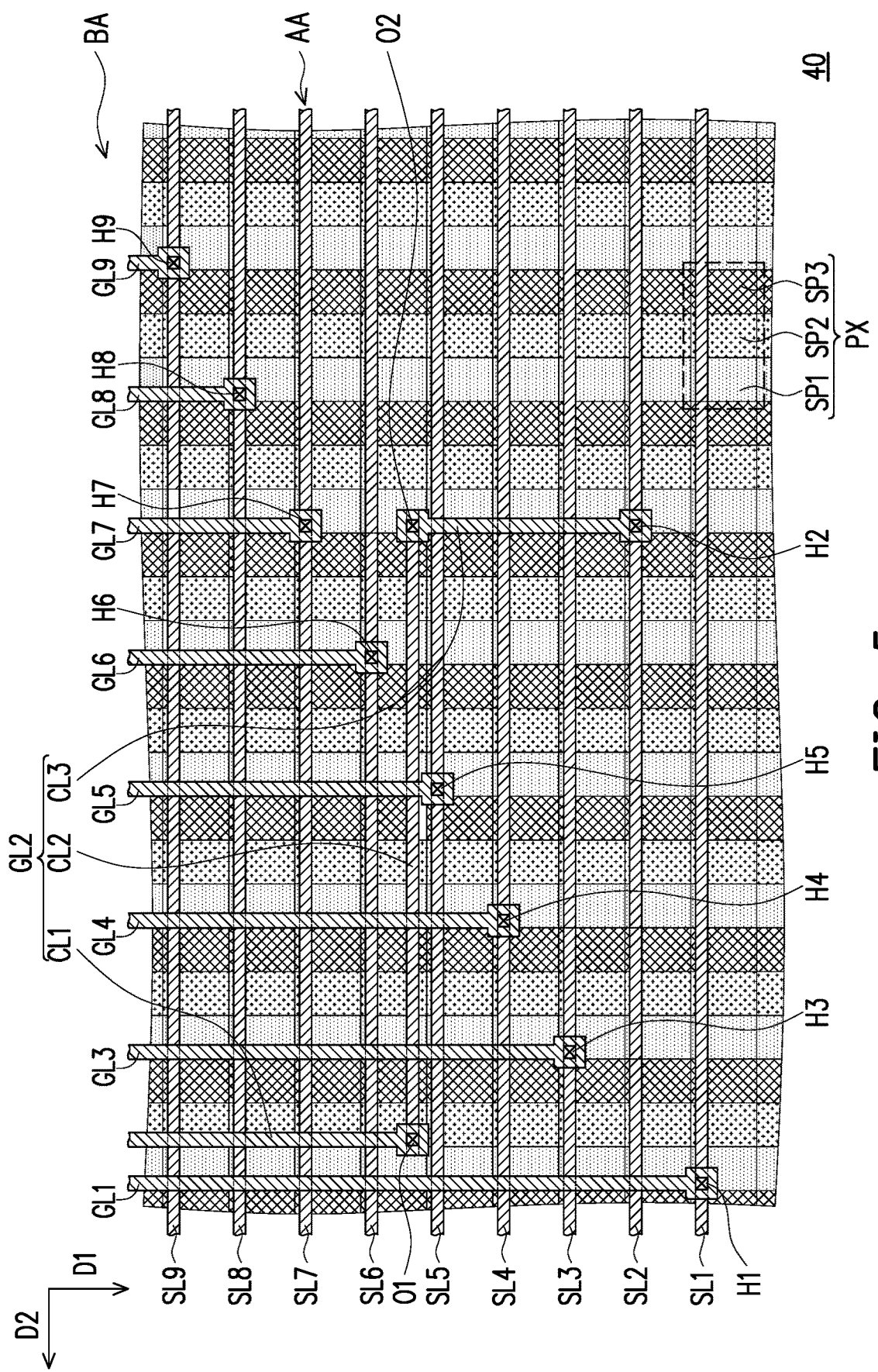
FIG. 5 is a schematic top view of a display device according to an embodiment of the disclosure.

FIG. 5 is a schematic top view of a display device according to an embodiment of the disclosure. It is noted that the embodiment of FIG. 5 uses the reference numerals and a part of the contents of the embodiment of FIG. 2A and FIG. 2B, and the same or similar reference numerals are used to denote the same or similar elements, and the description of the same technical content is omitted. For the description of the omitted part, reference may be made to the foregoing embodiment, and details are not described herein.

The main difference between a display device 40 of FIG. 5 and the display device 20 of FIG. 2A is that the first wire CL1 of the gate transmission line GL2 of the display device 40 is located between the gate transmission line GL1 and the gate transmission line GL3.

In the embodiment, the gate transmission line GL2 does not need to be provided with a fourth wire across other gate transmission lines in the peripheral area. In the embodiment, the second wire CL2 of the gate transmission line GL2 crosses the gate transmission lines GL3 to GL6, and the second wire CL2 overlaps the gate transmission lines GL3 to GL5.

Based on the above, the gate transmission line GL2 includes the first wire CL1 extending along the first direction D1, the second wire CL2 extending along the second direction D2, and the third wire CL3 extending along the first direction D1, whereby the influence of the gate transmission line GL2 on the display quality of the display device 40 may be reduced.

Figure 6:
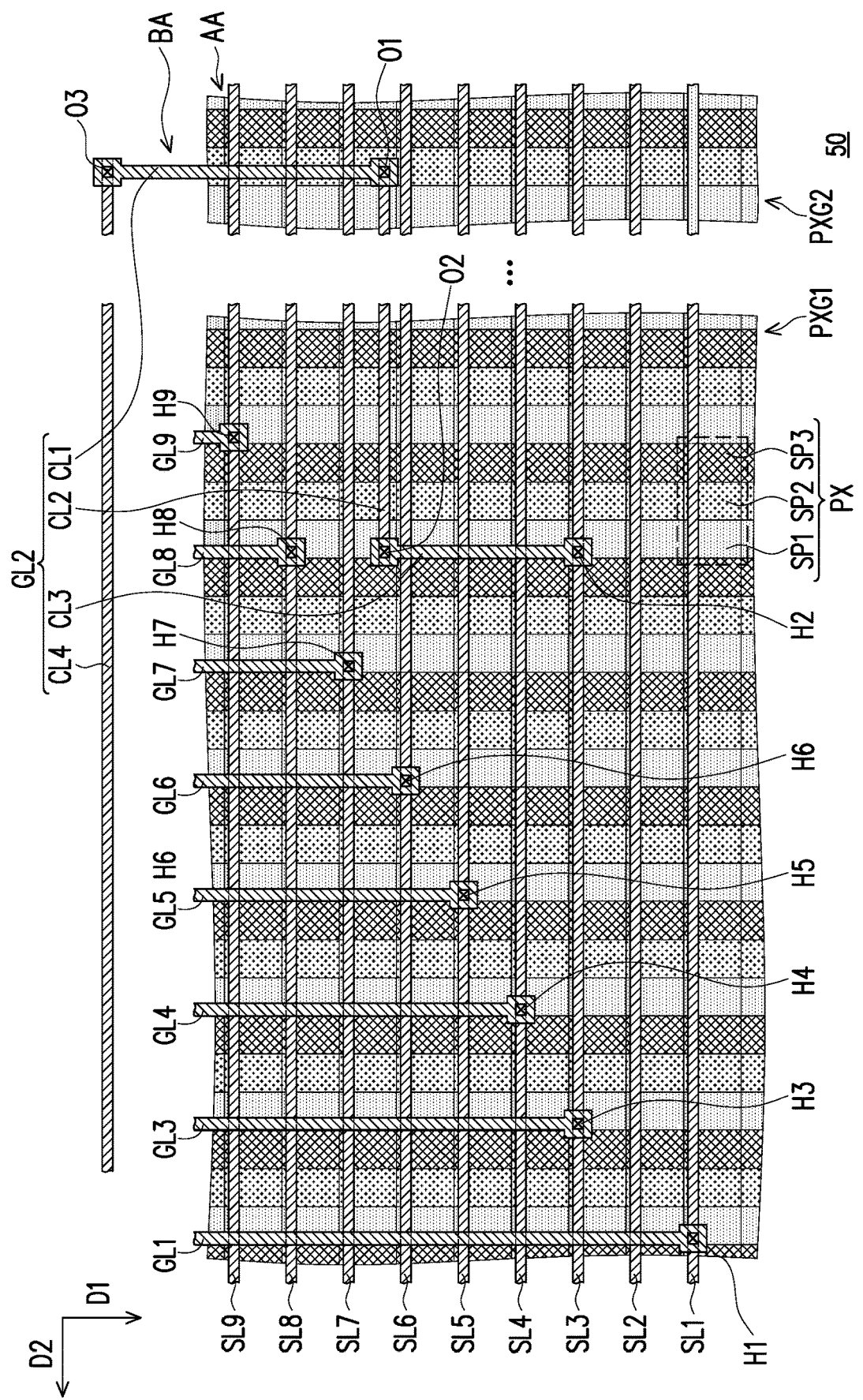
FIG. 6 is a schematic top view of a display device according to an embodiment of the disclosure.

FIG. 6 is a schematic top view of a display device according to an embodiment of the disclosure. It is noted that the embodiment of FIG. 6 uses the reference numerals and a part of the contents of the embodiment of FIG. 2A and FIG. 2B, and the same or similar reference numerals are used to denote the same or similar elements, and the description of the same technical content is omitted. For the description of the omitted part, reference may be made to the foregoing embodiment, and details are not described herein.

Please refer to FIG. 6. The number of pixels PX of a display device 50 in the second direction D2 is less than the number of gate transmission lines. In the embodiment, multiple rows of pixels PX (e.g., eight rows of pixels PX) in the second direction D2 are defined as one pixel group, and each pixel group corresponds to multiple gate transmission lines (e.g., the gate transmission lines GL1 to GL9). In the embodiment, one of the gate transmission lines (e.g., the gate transmission line GL2) is disposed in different pixel groups. For example, a first pixel group PXG1 includes the first row of pixels PX to the eighth row of pixels PX, and a second pixel group PXG2 adjacent to the first pixel group PXG1 includes the ninth row of pixels PX to the sixteenth row of pixels PX. Part of the gate transmission line GL2 overlaps the second pixel group PXG2, and part of the gate transmission line GL2 overlaps the first pixel group PXG1. In the embodiment, the first wire CL1 of the gate transmission line GL2 overlaps the sixteenth row of pixels PX, and the second wire CL2 of the gate transmission line GL2 extends from the second pixel group PXG2 into the first pixel group PXG1, and the third wire CL3 of the gate transmission line GL2 overlaps the boundary between the blue sub-pixels SP3 of the sixth row of pixels and the red sub-pixels SP1 of the seventh row of pixels PX.

Based on the above, the gate transmission line GL2 includes the first wire CL1 extending along the first direction D1, the second wire CL2 extending along the second direction D2, and the third wire CL3 extending along the first direction D1, whereby the influence of the gate transmission line GL2 on the display quality of the display device 50 may be reduced.

Figure 7A:
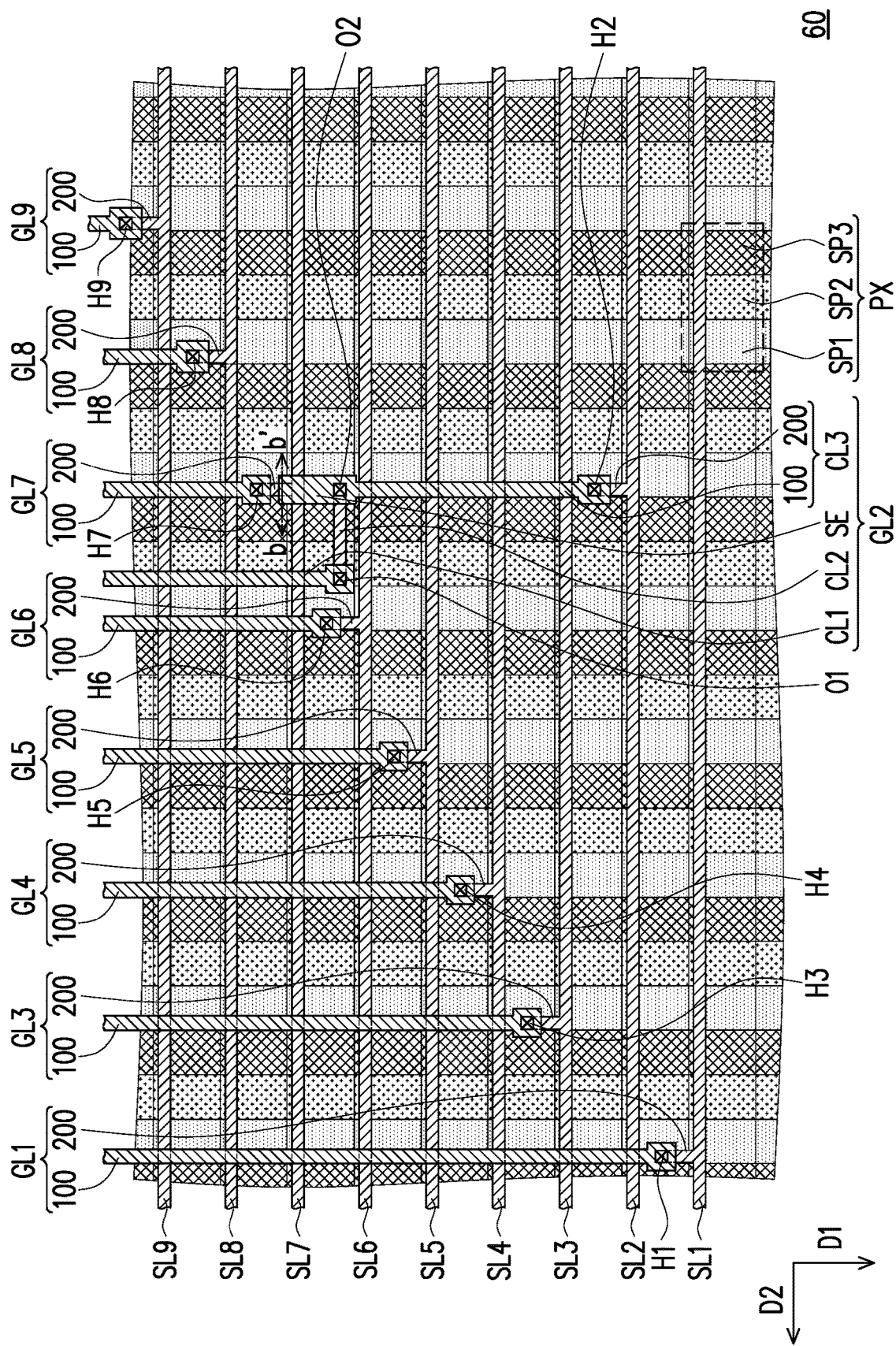
FIG. 7A is a schematic top view of a display device according to an embodiment of the disclosure.
Figure 7B:
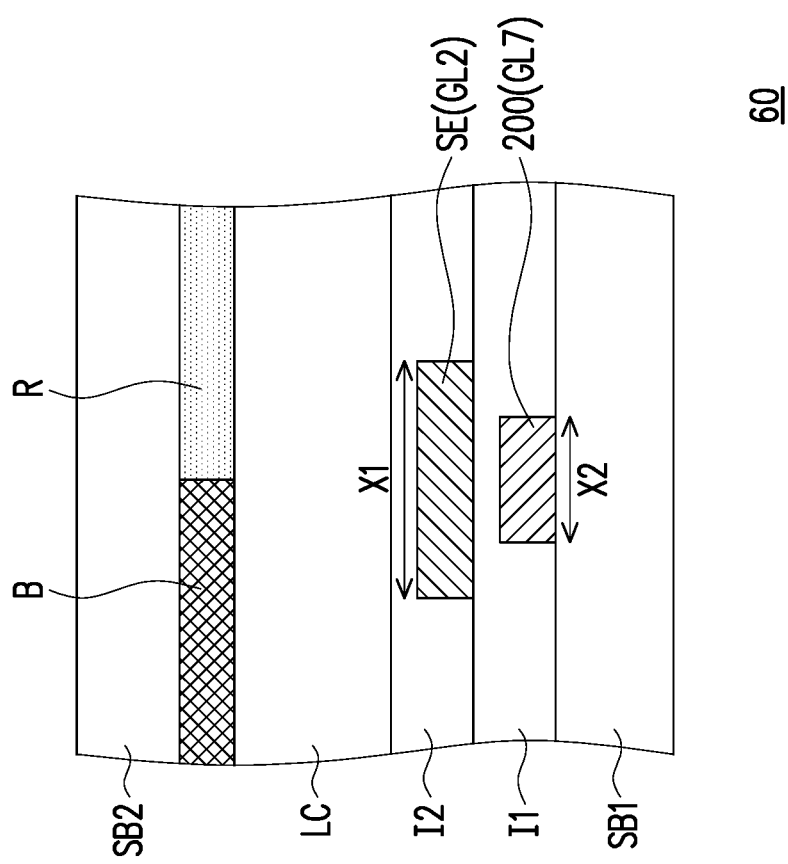
FIG. 7B is a schematic cross-sectional view taken along the line b-b' in FIG. 7A.

FIG. 7A is a schematic top view of a display device according to an embodiment of the disclosure. FIG. 7B is a schematic cross-sectional view taken along the line b-b' in FIG. 7A. It is noted that the embodiment of FIG. 7A and FIG. 7B uses the reference numerals and a part of the contents of the embodiment of FIG. 4, and the same or similar reference numerals are used to denote the same or similar elements, and the description of the same technical content is omitted. For the description of the omitted part, reference may be made to the foregoing embodiment, and details are not described herein.

The main difference between a display device 60 of FIG. 7A and the display device 30 of FIG. 4 is that the gate transmission line GL2 of the display device 60 further includes a shielding electrode SE.

Please refer to FIG. 7A and FIG. 7B. Each of the gate transmission lines GL1 to GL9 includes a first line segment 100 and a second line segment 200. The first line segments 100 and the data lines DL belong to the same conductive film layer. The second line segments 200 are electrically connected to the first line segments 100, and the second line segments 200 and the scan lines SL1 to SL9 belong to the same conductive film layer. In the embodiment, the first line segments 100 of the gate transmission lines GL1 to GL9 are electrically connected to the second line segments 200 of the gate transmission lines GL1 to GL9 through the openings H1 to H9, respectively, and the openings H1 to H9 penetrate, for example, the first insulating layer I1.

The second line segments 200 of the gate transmission lines GL1 to GL9 are directly connected to the corresponding scan lines SL1 to SL9, and the second line segments 200 of the gate transmission lines GL1 to GL9 and the corresponding scan lines SL1 to SL9 form T-shaped structures. For example, the second line segment 200 of the gate transmission line GL1 is directly connected to the scan line SL1; the second line segment 200 of the gate transmission line GL2 is directly connected to the scan line SL2; the second line segment 200 of the gate transmission line GL3 is directly connected to the scan line SL3; the second line segment 200 of the gate transmission line GL4 is directly connected to the scan line SL4; the second line segment 200 of the gate transmission line GL5 is directly connected to the scan line SL5; the second line segment 200 of the gate transmission line GL6 is directly connected to the scan line SL6; the second line segment 200 of the gate transmission line GL7 is directly connected to the scan line SL7; the second line segment 200 of the gate transmission line GL8 is directly connected to the scan line SL8; the second line segment 200 of the gate transmission line GL9 is directly connected to the scan line SL9.

In the embodiment, the gate transmission line GL2 includes the first wire CL1 extending along the first direction D1, the second wire CL2 extending along the second direction D2, and the third wire CL3 extending along the first direction D1, and the third wire CL3 of the gate transmission line GL2 includes the first line segment 100 and the second line segment 200.

In the embodiment, the gate transmission line GL2 further includes the shielding electrode SE, and the shielding electrode SE extends along the first direction D1 and overlaps another one of the gate transmission lines GL1 to GL9. For example, the shielding electrode SE of the gate transmission line GL2 overlaps the second line segment 200 of the gate transmission line GL7. In some embodiments, the width X1 of the shielding electrode SE of the gate transmission line GL2 is greater than the width X2 of the gate transmission line GL7 covered by the shielding electrode SE.

In the embodiment, the shielding electrode SE belongs to the same conductive film layer (e.g., the second metal layer) as the first line segment 100 of the third wire CL3 and the data lines (please refer to FIG. 1), and the shielding electrode SE is directly connected to the first line segment 100 of the third wire CL3.

In some embodiments, the gate transmission lines include first to n-th stages, where n is an integer greater than 5, and a gate transmission line including the shielding electrode is different from another gate transmission line overlapped by the shielding electrode by five stages or more. For example, in the embodiment, the second gate transmission line GL2 is different from the seventh gate transmission line GL7 by five stages. When the seventh gate transmission line GL7 is charged, a holding voltage is applied to the gate transmission line GL2. Therefore, when the gate transmission line GL7 is charged, the shielding electrode SE of the gate transmission line GL2 may reduce the negative influence of the gate transmission line GL7 on the display quality.

Figure 8:
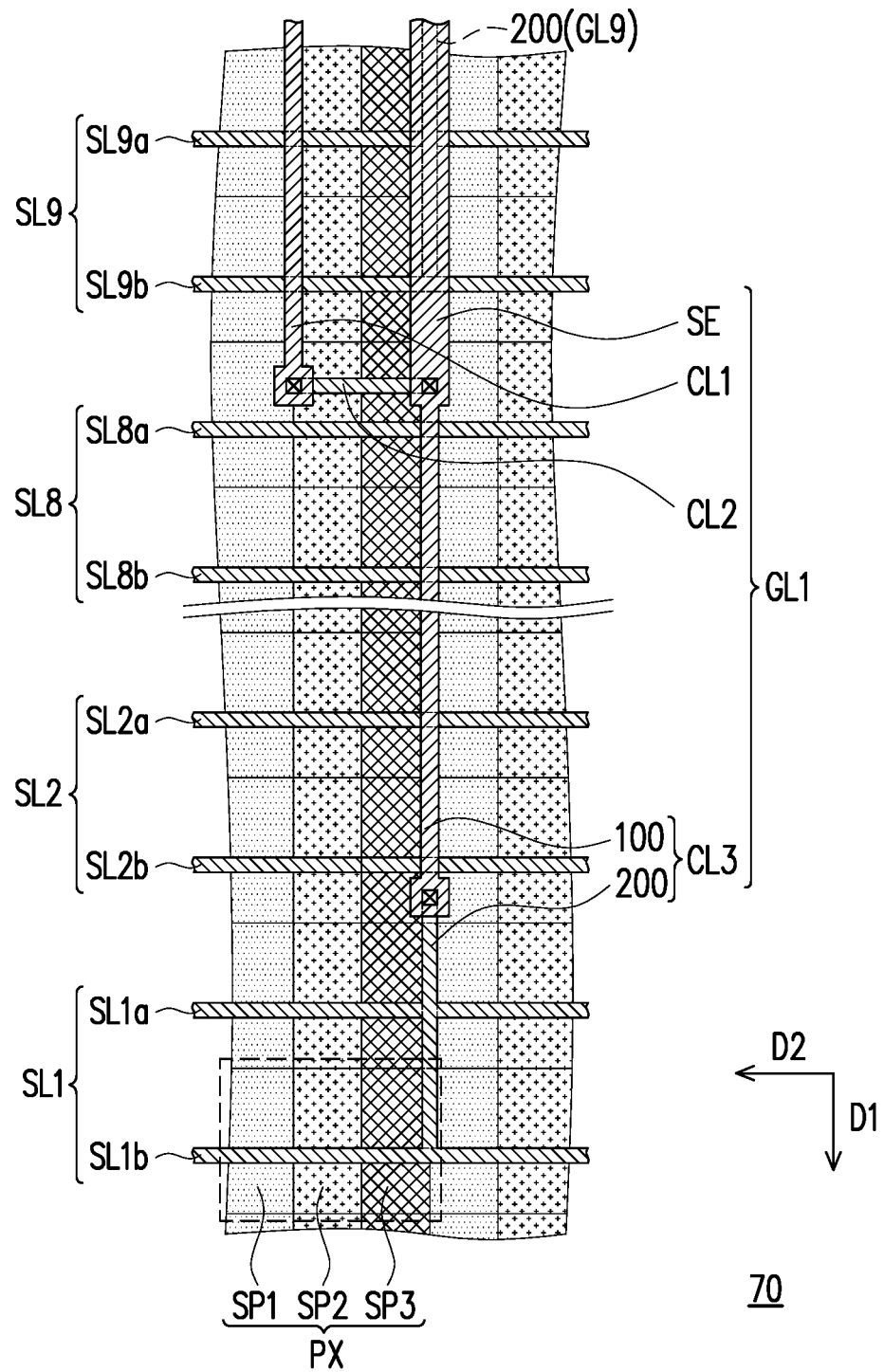
FIG. 8 is a schematic top view of a display device according to an embodiment of the disclosure.

FIG. 8 is a schematic top view of a display device according to an embodiment of the disclosure. It is noted that the embodiment of FIG. 8 uses the reference numerals and a part of the contents of the embodiment of FIG. 7A and FIG. 7B, and the same or similar reference numerals are used to denote the same or similar elements, and the description of the same technical content is omitted. For the description of the omitted part, reference may be made to the foregoing embodiment, and details are not described herein.

Please refer to FIG. 8. Each scan line of a display device 70 (only scan lines SL1, SL2, SL8 and SL9 are shown in the drawing) includes first gate lines SL1a, SL2a, SL8a and SL9a and second gate lines SL1b, SL2b, SL8b and SL9b parallel to each other. For example, the scan line SL1 includes the first gate line SL1a and the second gate line SL1b; the scan line SL2 includes the first gate line SL2a and the second gate line SL2b; the scan line SL9 includes the first gate line SL9a and the second gate line SL9b.

The second line segment of each gate transmission line is electrically connected to the corresponding first gate line and second gate line. For example, the second line segment 200 of the third wire CL3 of the gate transmission line GL1 is connected to the first gate line SL1a and the second gate line SL1b; the second line segment 200 of the gate transmission line GL9 is connected to the first gate line SL9a and the second gate line SL9b.

In the embodiment, the gate transmission line GL1 includes the first wire CL1, the second wire CL2, the third wire CL3, and the shielding electrode SE. The shielding electrode SE crosses the first gate line SL9a and the second gate line SL9b, and the shielding electrode SE overlaps the second line segment 200 of the gate transmission line GL9.

Based on the above, when the gate transmission line GL9 is charged, the shielding electrode SE of the gate transmission line GL1 may reduce the negative influence of the gate transmission line GL9 on the display quality.

Figure 9:
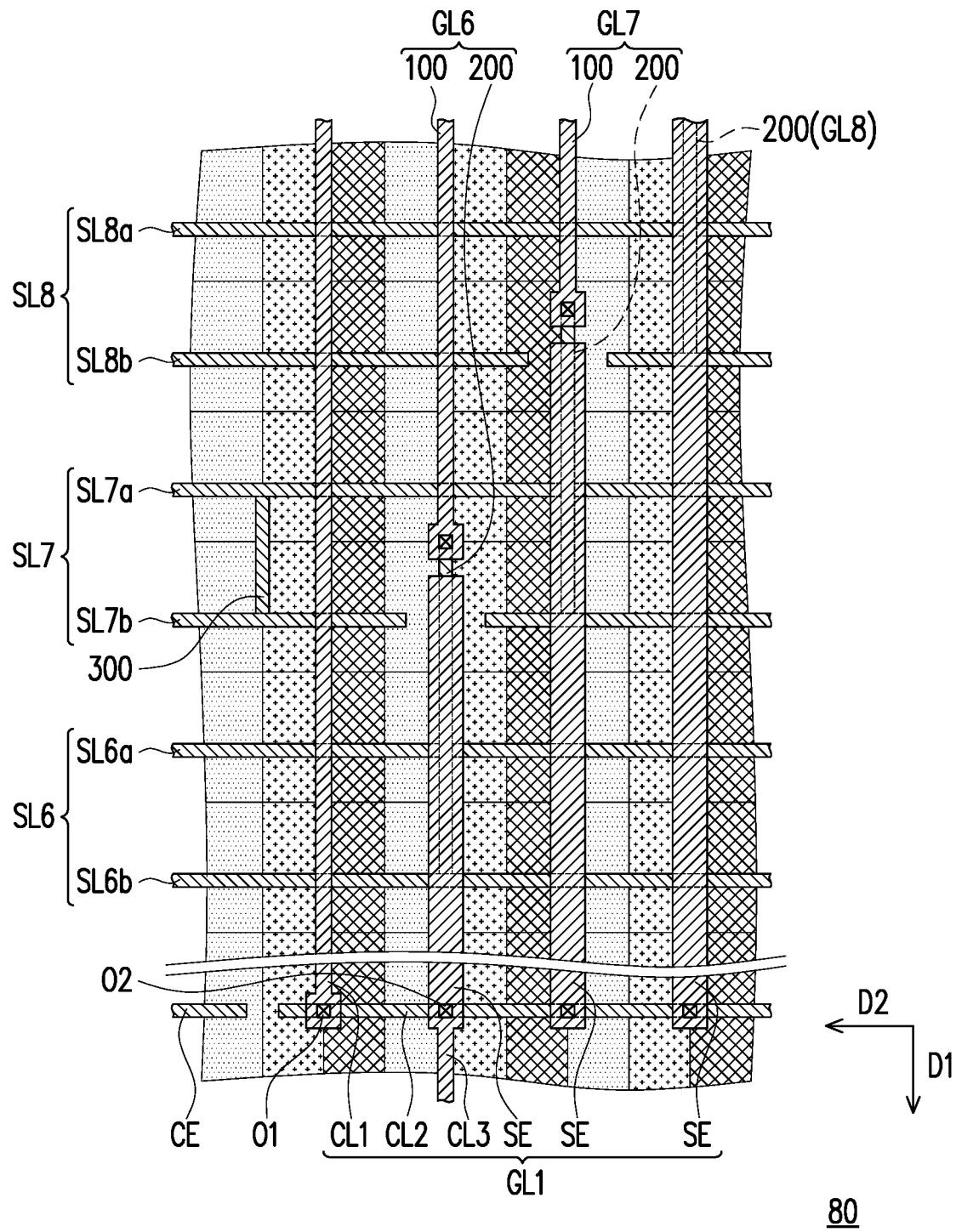
FIG. 9 is a schematic top view of a display device according to an embodiment of the disclosure.

FIG. 9 is a schematic top view of a display device according to an embodiment of the disclosure. It is noted that the embodiment of FIG. 9 uses the reference numerals and a part of the contents of the embodiment of FIG. 8, and the same or similar reference numerals are used to denote the same or similar elements, and the description of the same technical content is omitted. For the description of the omitted part, reference may be made to the foregoing embodiment, and details are not described herein.

Please refer to FIG. 9. Each scan line of a display device 80 (only scan lines SL6, SL7 and SL8 are shown in the drawing) includes first gate lines SL6a, SL7a and SL8a and second gate lines SL6b, SL7b and SL8b parallel to each other.

In the embodiment, part of the second gate lines SL6b, SL7b and SL8b may be disconnected at the first line segments 100 to prevent different scan lines from short-circuiting each other. For example, the first line segment 100 of the gate transmission line GL6 connects the first gate line SL6a and the second gate line SL6b, and the first line segment 100 of the gate transmission line GL6 passes through a gap of the second gate line SL7b of the gate transmission line GL7. In some embodiments, the first gate lines SL6a, SL7a and SL8a and the second gate lines SL6b, SL7b and SL8b may be connected through other bridge elements 300 in addition to through the corresponding first line segments 100. For example, the first gate line SL7a and the second gate line SL7b of the gate transmission line GL7 are electrically connected through a bridge element 300.

Therefore, even if the second gate line SL7b of the gate transmission line GL7 is disconnected at the first line segment 100 of the gate transmission line GL6, the second gate line SL7b still does not become disconnected. In the embodiment, the bridge element 300 and the scan lines belong to the same conductive film layer, but the disclosure is not limited thereto. In some embodiments, the bridge element 300 and the data lines may belong to the same conductive film layer; alternatively, the bridge element 300, the scan lines and the data lines may belong to different conductive film layers.

In the embodiment, the gate transmission line GL1 includes multiple shielding electrodes SE. The shielding electrodes SE are electrically connected to the second wire CL2 and extend along the first direction D1. The shielding electrodes SE overlap other ones of the gate transmission lines (e.g., the gate transmission lines GL6 to GL8), respectively. In the embodiment, the shielding electrodes SE are electrically connected to the second wire CL2 through, for example, multiple openings O2, respectively.

Based on the above, when the gate transmission lines GL6 to GL8 are charged, the shielding electrodes SE of the gate transmission line GL1 may reduce the negative influence of the gate transmission lines GL6 to GL8 on the display quality.

In the embodiment, the shielding electrode SE overlapping the gate transmission line GL6 crosses the second gate line SL7b in the first direction D1, and the shielding electrode SE overlapping the gate transmission line GL7 crosses the second gate line SL8b in the first direction D1, thereby improving the problem of mutual interference between different scan lines.

In the embodiment, the second wire CL2 is aligned with a common electrode CE in the second direction D2. For example, the common electrode CE belongs to the same conductive film layer as the second wire CL2, and the second wire CL2 may be formed by disconnecting the common electrode CE.

Figure 10:
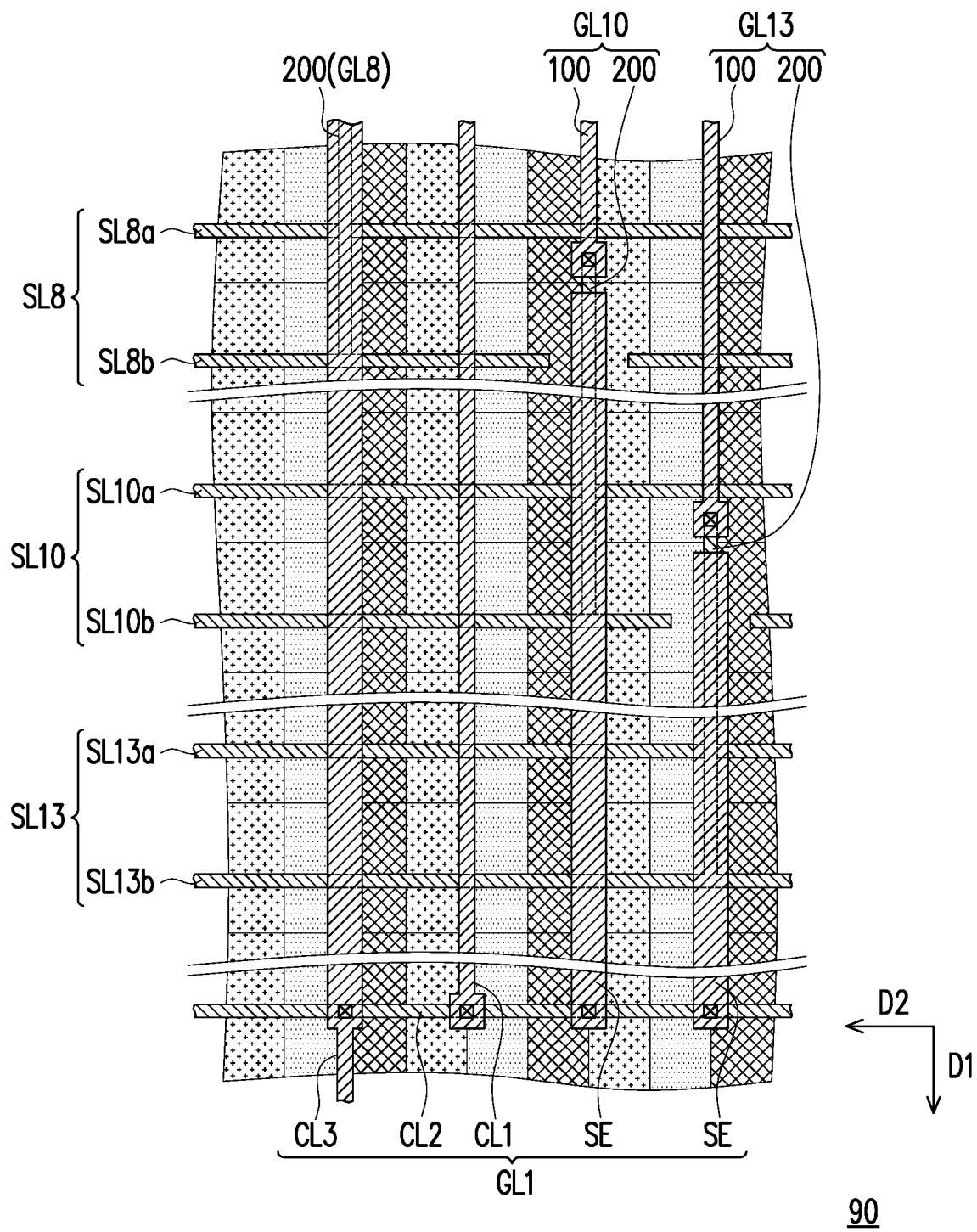
FIG. 10 is a schematic top view of a display device according to an embodiment of the disclosure.

FIG. 10 is a schematic top view of a display device according to an embodiment of the disclosure. It is noted that the embodiment of FIG. 10 uses the reference numerals and a part of the contents of the embodiment of FIG. 9, and the same or similar reference numerals are used to denote the same or similar elements, and the description of the same technical content is omitted. For the description of the omitted part, reference may be made to the foregoing embodiment, and details are not described herein.

Please refer to FIG. 10. Each scan line of a display device 90 (only scan lines SL8, SL10 and SL13 are shown in the drawing) includes first gate lines SL8a, SL10a and SL13a and second gate lines SL8b, SL10b and SL13b parallel to each other.

In the embodiment, the gate transmission line GL1 includes multiple shielding electrodes SE. The shielding electrodes SE are electrically connected to the second wire CL2 and extend along the first direction D1. The shielding electrodes SE overlap other ones of the gate transmission lines (e.g., the gate transmission lines GL8, GL10 and GL13), respectively.

In some embodiments, part of the scan lines may be divided into multiple parts separated from each other by the gate transmission lines; however, multiple separated parts of the same scan line may be electrically connected to each other by a bridge element 300 similar to the one shown in the foregoing embodiment or by other wires in the display panel. In some embodiments, by providing multiple signal sources (driving chip) to the same scan line, multiple separated parts of the same scan line have the same driving signal, thereby achieving the effect of multiple driving.

Based on the above, the shielding electrodes SE of the gate transmission line GL1 may shield the gate transmission lines GL8, GL10 and GL13 when the gate transmission lines GL8, GL10 and GL13 are charged, which reduces the negative influence of the gate transmission lines GL8, GL10 and GL13 on the display quality.

Figure 11A:
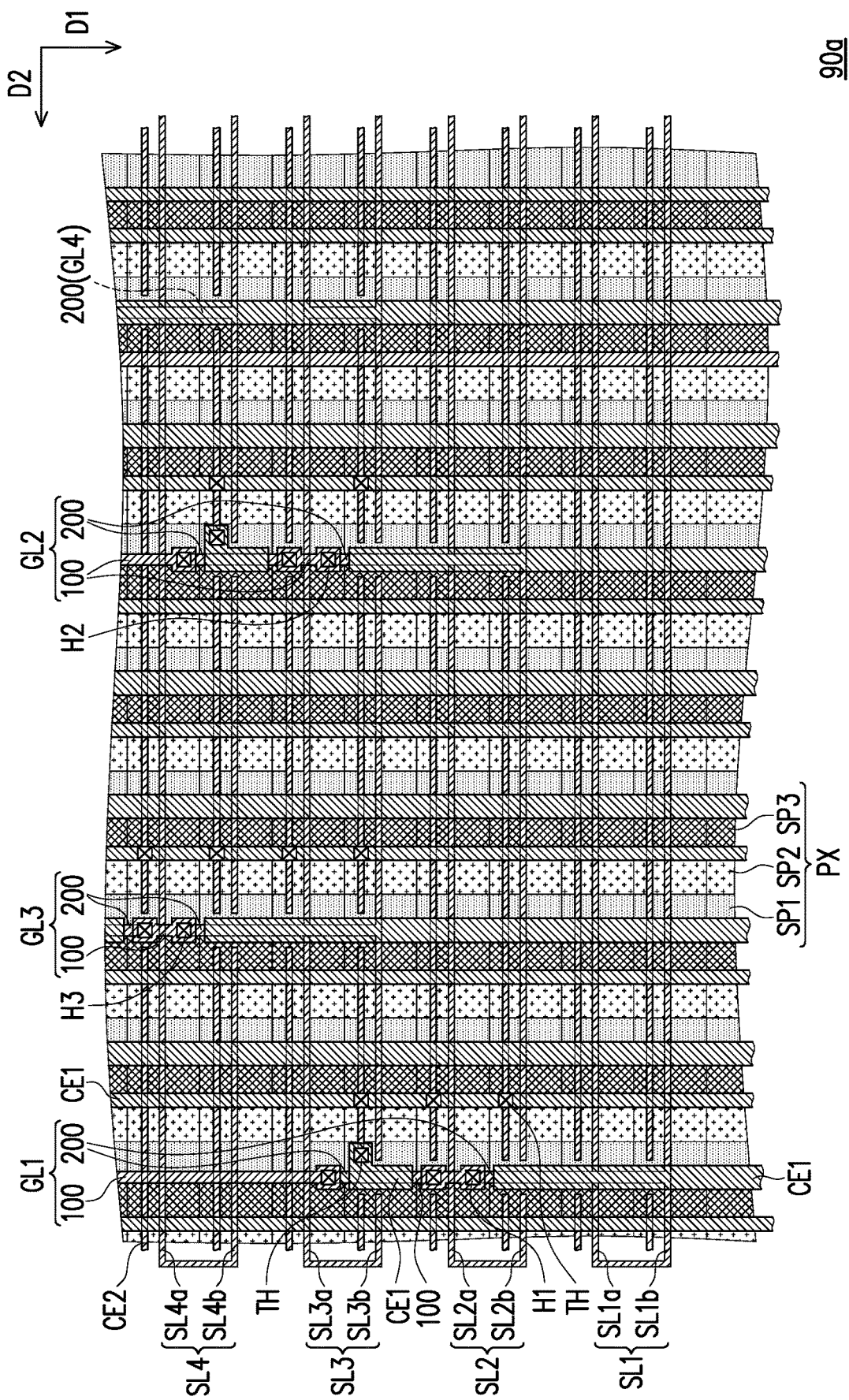
FIG. 11A and FIG. 11B are schematic top views of a display device according to an embodiment of the disclosure.
Figure 11B:
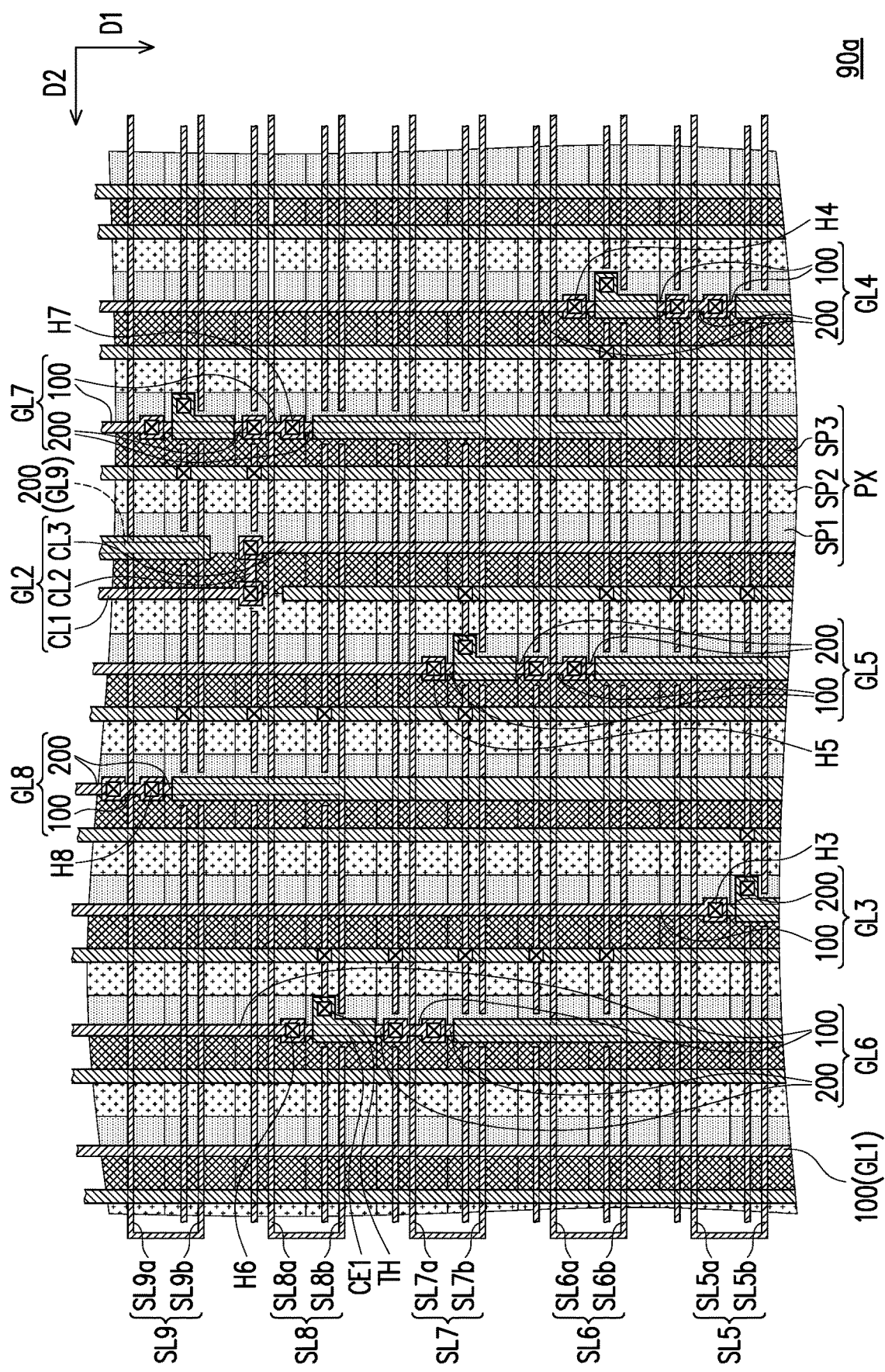

FIGS. 11A and 11B are schematic top views of a display device according to an embodiment of the disclosure, and FIG. 11B is continued from the upper side of FIG. 11A. It is noted that the embodiment of FIG. 11A and FIG. 11B uses the reference numerals and a part of the contents of the embodiment of FIG. 10, and the same or similar reference numerals are used to denote the same or similar elements, and the description of the same technical content is omitted. For the description of the omitted part, reference may be made to the foregoing embodiment, and details are not described herein.

Please refer to FIG. 11A and FIG. 11B. A display device 90a has a display area and a peripheral area (please refer to FIG. 1) and includes multiple data lines (please refer to FIG. 1), first to n-th scan lines SL1 to SLn, first to n-th gate transmission lines GL1 to GLn, and multiple sub-pixels, where n is an integer greater than 1. In the embodiment, n is 9. The sub-pixels (e.g., the red sub-pixels SP1, the green sub-pixels SP2, and the blue sub-pixels SP3) are electrically connected to the first to n-th scan lines SL1 to SLn and the data lines.

The data lines extend from the peripheral area into the display area, and the data lines located in the display area extend along the first direction D1.

The first to n-th scan lines SL1 to SLn are located in the display area and extend along the second direction D2 intersecting the first direction D1. The first to n-th scan lines SL1 to SLn are arranged in sequence along the first direction D1. In the embodiment, the first to ninth scan lines SL1 to SL9 include first gate lines SL1a to SL9a and second gate lines SL1b to SL9b parallel to each other, respectively. For example, the scan line SL1 includes the first gate line SL1a and the second gate line SL1b; the scan line SL9 includes the first gate line SL9a and the second gate line SL9b.

The first to n-th gate transmission lines GL1 to GLn extend from the peripheral area into the display area and are electrically connected to the first to n-th scan lines SL1 to SLn, respectively. In the embodiment, each of the first to n-th gate transmission lines GL1 to GLn includes one or more first line segments 100 and one or more second line segments 200. The first line segments 100 and the data lines belong to the same conductive film layer. The second line segments 200 and the first to n-th scan lines SL1 to SLn belong to the same conductive film layer. In the embodiment, the first line segments 100 of the first to ninth gate transmission lines GL1 to GL9 are electrically connected to the second line segments 200 of the first to ninth gate transmission lines GL1 to GL9 through first openings H1 to H9 (FIG. 11B omits the first line segments 100 of the ninth gate transmission line GL9 and the first opening H9), respectively, and the first openings H1 to H9 penetrate, for example, the first insulating layer (please refer to FIG. 2B). The first to ninth scan lines SL1 to SL9 are directly connected to the second line segments 200 of the first to ninth gate transmission lines GL1 to GL9, respectively.

In some embodiments, the first to ninth gate transmission lines GL1 to GL9 cross the first to n-th scan lines SL1 to SLn by part of the first line segments 100. For example, the first gate transmission line GL1 crosses the first gate line SL2a of the second scan line SL2, the first gate line SL3a of the third scan line SL3, and the fourth to ninth scan lines SL4 to SL9 by the first line segments 100. In addition, the second gate line SL2b of the second scan line SL2 and the second gate line SL3b of the third scan line SL3 are disconnected at the second line segments 200 of the first gate transmission line GL1. Based on the above, it is possible to prevent the short circuit of the first gate transmission line GL1 and the second scan line SL2 to the ninth scan line SL9. Other gate transmission lines have similar configurations to prevent the short circuit of scan lines of different stages.

In the embodiment, the display device 90a further includes multiple first common electrodes CE1 and multiple second common electrodes CE2. The first common electrodes CE1 and the data lines belong to the same conductive film layer. The second common electrodes CE2 and the scan lines belong to the same conductive film layer.

The first common electrodes CE1 extend along the first direction D1, and at least a part of the first common electrodes CE1 overlap the second line segments 200 of the first to ninth gate transmission lines GL1 to GL9, thereby reducing the mutual interference between different gate transmission lines. In the embodiment, part of the first common electrodes CE1 are located between two first line segments 100 in the same gate transmission line. In the embodiment, the first common electrodes CE1 overlap the boundaries between the green sub-pixels SP2 and the blue sub-pixels SP3 and the boundaries between the red sub-pixels SP1 and the blue sub-pixels SP3.

In some embodiments, the display device 90a further includes a third common electrode (not shown) and/or a fourth common electrode (not shown). The third common electrode overlaps the boundary between the green sub-pixels SP2 and the red sub-pixels SP1 and is parallel to the data lines. The fourth common electrode is parallel to the scan lines. The voltage applied to the first common electrodes CE1 and the second common electrodes CE2 is different from the voltage applied to the third common electrode and the fourth common electrode. For example, a voltage of 9 volts is applied to the first common electrodes CE1 and the second common electrodes CE2, and a voltage of 6 volts is applied to the third common electrode and the fourth common electrode.

The second common electrodes CE2 extend along the second direction D2. At least a part of the first common electrodes CE1 are electrically connected to at least a part of the second common electrodes CE2 through second openings TH, and the second openings TH penetrate, for example, the first insulating layer (please refer to FIG. 2B). The number of second openings TH may be adjusted according to requirements and is not limited to the number shown in FIG. 11A and FIG. 11B.

In the display area, the first to n-th gate transmission lines GL1 to GLn are arranged in dislocation, so the first openings H1 to H9 and the second openings TH may be more evenly distributed in the display area, thereby preventing bright lines from occurring in the display device 90a. In addition, the problem that the first openings H1 to H9 and the second openings TH compress the disposition space of each other may be improved.

In the display area of the display device 90a, the first gate transmission line GL1, the sixth gate transmission line GL6, the third gate transmission line GL3, the eighth gate transmission line GL8, the fifth gate transmission line GL5, the second gate transmission line GL2 (or the ninth gate transmission line GL9), the seventh gate transmission line GL7, and the fourth gate transmission line GL4 are arranged in sequence (e.g., from left to right in sequence), and the distance between the gate transmission lines of adjacent stages is greater than or equal to 6 times the width of the sub-pixel. For example, in the display area, the distance between the first gate transmission line GL1 and the second gate transmission line GL2 is greater than or equal to 6 times the width of the sub-pixel, thereby further enabling the first openings H1 to H9 and the second openings TH to be evenly distributed.

In some embodiments, the signal sources in the driving chip corresponding to the first to ninth gate transmission lines GL1 to GL9 are arranged in sequence, and in the peripheral area, the arrangement sequence of the first to ninth gate transmission lines GL1 to GL9 are adjusted by other lines. For example, a transfer line area is provided at a position about 200 microns from the display area, thereby adjusting the arrangement sequence of the first to ninth gate transmission lines GL1 to GL9 in the display area. In other embodiments, the arrangement sequence of the signal sources in the driving chip corresponding to the first to ninth gate transmission lines GL1 to GL9 is identical to the arrangement sequence of the first to ninth gate transmission lines GL1 to GL9 in the display area.

Figure 12A:
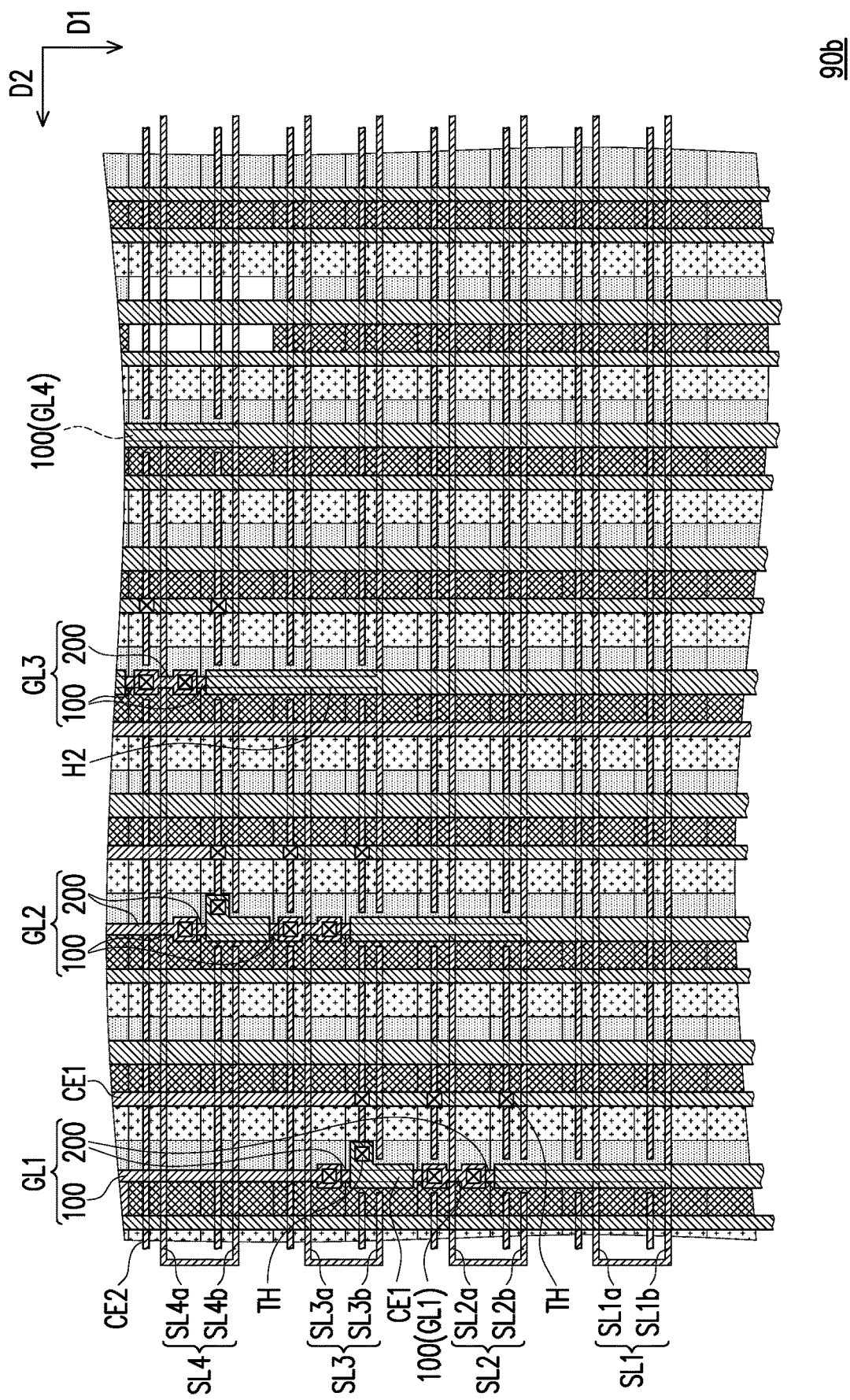
FIG. 12A and FIG. 12B are schematic top views of a display device according to an embodiment of the disclosure.
Figure 12B:
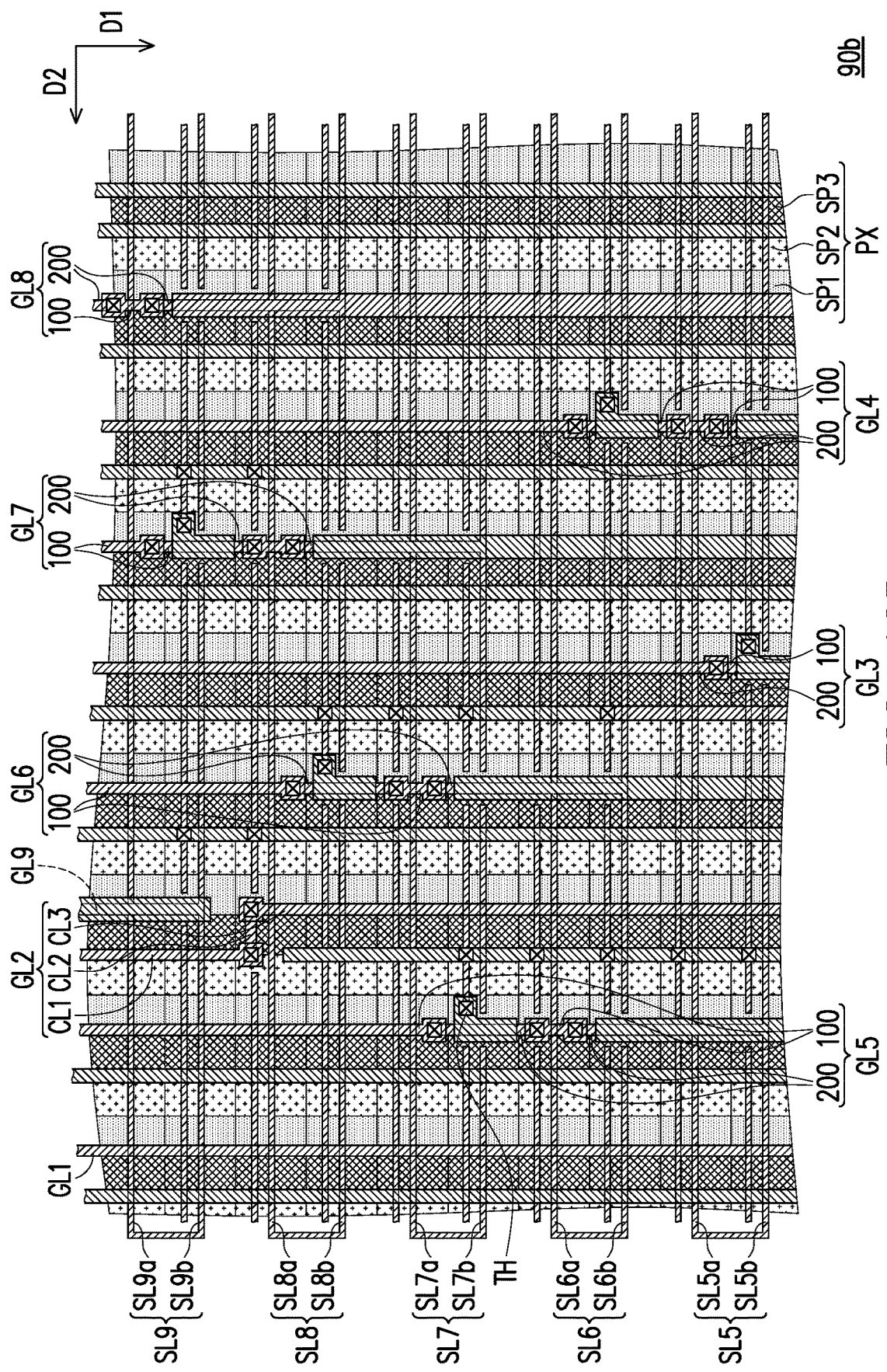

FIG. 12A and FIG. 12B are schematic top views of a display device according to an embodiment of the disclosure, and FIG. 12B is continued from the upper side of FIG. 12A. It is noted that the embodiment of FIG. 12A and FIG. 12B uses the reference numerals and a part of the contents of the embodiment of FIG. 11A and FIG. 11B, and the same or similar reference numerals are used to denote the same or similar elements, and the description of the same technical content is omitted. For the description of the omitted part, reference may be made to the foregoing embodiment, and details are not described herein.

Please refer to FIG. 12A and FIG. 12B. In a display area of a display device 90b, the first gate transmission line GL1, the fifth gate transmission line GL5, the second gate transmission line GL2 (or the ninth gate transmission line GL9), the sixth gate transmission line GL6, the third gate transmission line GL3, the seventh gate transmission line GL7, the fourth gate transmission line GL4, and the eighth gate transmission line GL8 are arranged in sequence, and the distance between the gate transmission lines of adjacent stages is greater than or equal to 6 times the width of the sub-pixel. For example, in the display area, the distance between the first gate transmission line GL1 and the second gate transmission line GL2 is greater than or equal to 6 times the width of the sub-pixel, thereby further enabling the first openings H1 to H9 and the second openings TH to be evenly distributed.

Based on the above, the first openings H1 to H9 and the second openings TH may be more evenly distributed in the display area, thereby preventing bright lines from occurring in the display device 90b. In addition, the problem that the first openings H1 to H9 and the second openings TH compress the disposition space of each other may be improved.

What is claimed is:
1. A display device having a display area and a peripheral area and comprising:
 a plurality of data lines extending from the peripheral area into the display area, wherein the data lines located in the display area extend along a first direction;
 a plurality of scan lines located in the display area and extending along a second direction intersecting the first direction;

a plurality of gate transmission lines extending from the peripheral area into the display area and being electrically connected to the scan lines, wherein one of the gate transmission lines comprises:
  a first wire located in the display area and extending along the first direction;
  a second wire located in the display area and extending along the second direction; and
  a third wire located in the display area and extending along the first direction, wherein the first wire, the second wire, and the third wire are electrically connected in sequence, and the third wire is electrically connected to one of the scan lines; and
a plurality of sub-pixels electrically connected to the scan lines and the data lines.

2. The display device according to claim 1, wherein the one of the gate transmission lines further comprises:
  a fourth wire located in the peripheral area and extending along the second direction, wherein the fourth wire is electrically connected to the first wire.

3. The display device according to claim 1, wherein the sub-pixels comprise a plurality of red sub-pixels, a plurality of green sub-pixels, and a plurality of blue sub-pixels, and the third wire overlaps a boundary between the red sub-pixels and the blue sub-pixels.

4. The display device according to claim 1, wherein the sub-pixels comprise a plurality of red sub-pixels, a plurality of green sub-pixels, and a plurality of blue sub-pixels, and the first wire overlaps a boundary between the red sub-pixels and the green sub-pixels or a boundary between the blue sub-pixels and the green sub-pixels.

5. The display device according to claim 1, wherein the length of the third wire is greater than the length of each of the sub-pixels.

6. The display device according to claim 5, wherein in each frame, each of the scan lines has a main charging time and a pre-charging time, the pre-charging time is t times the main charging time, and the length of the third wire is greater than the length of t number of the sub-pixels, where t is an integer greater than 1.

7. The display device according to claim 1, wherein the second wire and the scan lines belong to a same conductive film layer.

8. The display device according to claim 1, wherein the first wire, the third wire and the data lines belong to a same conductive film layer.

9. The display device according to claim 1, further comprising:
  a driving circuit located on the peripheral area and on one side of the display area, wherein the gate transmission lines are electrically connected to the driving circuit.

10. The display device according to claim 1, further comprising:
  X gate driving elements, wherein each of the gate driving elements is electrically connected to a same one of the scan lines through different ones of the gate transmission lines, where X is an integer greater than 1.

11. The display device according to claim 10, wherein the sub-pixels are arrayed into a plurality of pixels, the pixels are arranged in N rows along the first direction and in M rows along the second direction, and M/X is less than N.

12. The display device according to claim 1, wherein the one of the gate transmission lines further comprises:
  a shielding electrode electrically connected to the second wire and extending along the first direction, wherein the shielding electrode overlaps another one of the gate transmission lines.

13. The display device according to claim 12, wherein the width of the shielding electrode is greater than the width of the another one of the gate transmission lines covered by the shielding electrode.

14. The display device according to claim 13, wherein the another one of the gate transmission lines comprises:
  a first line segment which belongs to a same conductive film layer as the data lines; and
  a second line segment which is connected to the first line segment and which belongs to a same conductive film layer as the scan lines, wherein the second line segment is directly connected to another one of the scan lines.

15. The display device according to claim 12, wherein the gate transmission lines comprise first to n-th stages, where n is an integer greater than 5, and the one of the gate transmission lines is different from the another one of the gate transmission lines by five stages or more.

16. The display device according to claim 1, wherein the one of the gate transmission lines further comprises:
  a plurality of shielding electrodes electrically connected to the second wire and extending along the first direction, wherein the shielding electrodes overlap other ones of the gate transmission lines.

17. The display device according to claim 1, wherein each of the scan lines comprises a first gate line and a second gate line parallel to each other.

18. The display device according to claim 1, wherein the gate transmission lines comprise first to n-th gate transmission lines, and the first to n-th gate transmission lines are arranged in dislocation in the display area, where n is an integer greater than 1.

19. A display device having a display area and a peripheral area and comprising:
  a plurality of data lines extending from the peripheral area into the display area, wherein the data lines located in the display area extend along a first direction;
  first to n-th scan lines located in the display area and extending along a second direction intersecting the first direction, where n is an integer greater than 1, and the first to n-th scan lines are arranged in sequence along the first direction;
  first to n-th gate transmission lines extending from the peripheral area into the display area and being electrically connected to the first to n-th scan lines, respectively, wherein the first to n-th gate transmission lines are arranged in dislocation in the display area; and
  a plurality of sub-pixels electrically connected to the first to n-th scan lines and the data lines.

20. The display device according to claim 19, wherein in the display area, the distance between the first gate transmission line and the second gate transmission line is greater than or equal to 6 times the width of each of the sub-pixels.

21. The display device according to claim 19, wherein the first gate transmission line comprises:
  a first line segment which belongs to a same conductive film layer as the data lines; and
  a second line segment which belongs to a same conductive film layer as the first to n-th scan lines, wherein the first line segment is electrically connected to the second line segment through a first opening.

22. The display device according to claim 21, further comprising:
  a first common electrode extending along the first direction and overlapping the second line segment; and a second common electrode extending along the second direction, wherein the first common electrode is electrically connected to the second common electrode through a second opening.

* * * * *